United States Patent [19]

Besserer et al.

[11] Patent Number: 5,761,797
[45] Date of Patent: Jun. 9, 1998

[54] PROCESS FOR CONSTRUCTING A SWITCHGEAR CABINET AND FOR INSTALLING INTERIOR COMPONENTS

[75] Inventors: Horst Besserer, Herborn; Udo Münch, Sinn; Markus Neuhof, Ehringshausen; Walter Nicolai, Buseck; Adam Pawlowski, Dillenburg; Matthias Schüler, Dietzhölztal; Heinrich Strackbein, Biebertal, all of Germany

[73] Assignee: Rittal-Werk Rudolf Loh GmbH & Co. KG, Germany

[21] Appl. No.: 646,311

[22] PCT Filed: Nov. 29, 1994

[86] PCT No.: PCT/EP94/03960

§ 371 Date: Aug. 7, 1996

§ 102(e) Date: Aug. 7, 1996

[87] PCT Pub. No.: WO95/15675

PCT Pub. Date: Jun. 8, 1995

[30] Foreign Application Priority Data

Dec. 1, 1993 [DE] Germany ............... 43 40 934.2

[51] Int. Cl.[6] .................................................. H01R 43/00
[52] U.S. Cl. ........................ 29/825; 361/752; 361/829
[58] Field of Search ............... 29/825, 830; 361/829, 361/752, 796

[56] References Cited

U.S. PATENT DOCUMENTS

| | | |
|---|---|---|
| 3,689,128 | 9/1972 | Andreini et al. . |
| 3,755,712 | 8/1973 | Yoshii et al. . |
| 4,040,694 | 8/1977 | Lascarrou ............... 361/829 X |
| 4,643,319 | 2/1987 | Debus . |
| 5,388,903 | 2/1995 | Jones et al. ............. 361/829 X |
| 5,488,543 | 1/1996 | Mazura et al. . |

FOREIGN PATENT DOCUMENTS

| | | |
|---|---|---|
| 0129695 | 1/1985 | European Pat. Off. . |
| 0158216 | 10/1985 | European Pat. Off. . |
| 0522252 | 1/1993 | European Pat. Off. . |
| 2207402 | 6/1974 | France . |
| 7211693 | 6/1972 | Germany . |
| 3300066 | 7/1984 | Germany . |
| 244028 | 3/1987 | Germany . |
| 53-108206 | 9/1978 | Japan ............... 361/829 |
| 1617 505 | 12/1990 | U.S.S.R. ............ 361/829 |

OTHER PUBLICATIONS

Machine Design., Bd. 58, Nr. 26, Nov. 1986, Cleveland US. Sieten 101–106, Paul J. Dvorak, "Modular enclosures beyond the basic box", siehe das ganze Dokument.

*Primary Examiner*—Carl J. Arbes
*Attorney, Agent, or Firm*—Speckman Pauley Petersen & Fejer

[57] ABSTRACT

A process for the erection of a switch cabinet and installation of components therein in which portions of the framework of the switch cabinet are assembled to form a partial frame structure. Thereafter, the services are installed and wired within the partial frame structure. The assembly of the framework is then completed and the walls and doors secured thereto so as to form an enclosed switch cabinet with the services installed inside.

14 Claims, 4 Drawing Sheets

PROCESS FOR CONSTRUCTING A SWITCHGEAR CABINET AND FOR INSTALLING INTERIOR COMPONENTS

BACKGROUND OF THE INVENTION

1. Field of the Invention

This invention relates to a process for the erection of a switch cabinet from a framework comprising frame limbs, at least one cabinet door, and wall elements, and for the installation and wiring of fittings to be accommodated in the switch cabinet such as a mounting plate, mounting rails, module carriers, installation instruments and the like.

2. Description of the Prior Art

As a rule, switch cabinets are assembled at, factory and taken to the site of use as a finished product where the user installs the services. In such cases, it is not unusual for the manufacturer to equip the switch cabinet with readily installed mounting means and the like such as current distribution components. However, the final equipping of the switch cabinet takes place only at the site of use by the user.

Construction modules for switch cabinets are also known which can be delivered in a space-saving manner. At the site of use, the switch cabinet is first assembled by the user. After the erection of the switch cabinet, the installation of the services is carrier out.

In any event, the installation and wiring of the services in such a complete switch cabinet is not easy because the accessibility of the space enclosed by the switch cabinet is often unnecessarily impeded or additional means such as pivoting frames are necessary in order to render the installed units accessible.

SUMMARY OF THE INVENTION

It is an object of this invention to provide an apparatus of the type herein referred to in which the components of the switch cabinet are delivered in a space-saving manner and can be so assembled at the site of use such that the installation of the services is possible in a simple manner with good accessibility.

This and other object are attained the process of this invention wherein from four frame limbs, a basic frame structure is assembled or a pre-manufactured frame is used, assembled from four frame limbs. At least at the bottom corners of this basic frame, additional frame limbs vertical thereto are fitted, forming a partial frame structure. The services are built into this partial frame structure and wired therein. The partial frame structure is then completed as a framework and the cabinet door and the wall elements are fitted to the framework having the services installed therein.

It is possible to commence the installation of services at the site of use even when only the partial frame structure has been assembled. The lower frame limbs projecting at right angles from the base frame permit the partial frame structure to be placed upright. The installation and wiring of the services is simple because the open partial frame structure permits access from all sides to the actual and still open interior of the switch cabinet. Finally, the cabinet door and the wall elements are fitted to the completed frame structure.

In according with one preferred embodiment, the partial frame structure is completed to form the complete framework using a further preferably premanufactured frame.

In order to complete the switch cabinet, the lower side of the frame structure is connected to a pedestal and the underside of the frame structure is closed by sectional bottom panels provided with cable inlets.

When installing the services in the partial frame structure in accordance with one embodiment of this invention, a mounting panel fitted with an installation apparatus is inserted into the partial frame structure and preferably connected to the base frame. In that case, the fitting of services and wiring to the mounting panel may then be carried out outside of the partial frame structure.

The installation of installation apparatus and the like is further facilitated by mounting rails which are fitted to the partial frame structure.

In accordance with one embodiment, it is also possible to fit into and wire in the partial frame structure module carriers into which plug-in units may subsequently be fitted.

BRIEF DESCRIPTION OF THE DRAWINGS

This invention will be better understood from the following detailed description taken in conjunction with the drawings, wherein.

DESCRIPTION OF PREFERRED EMBODIMENTS

Figure 1:
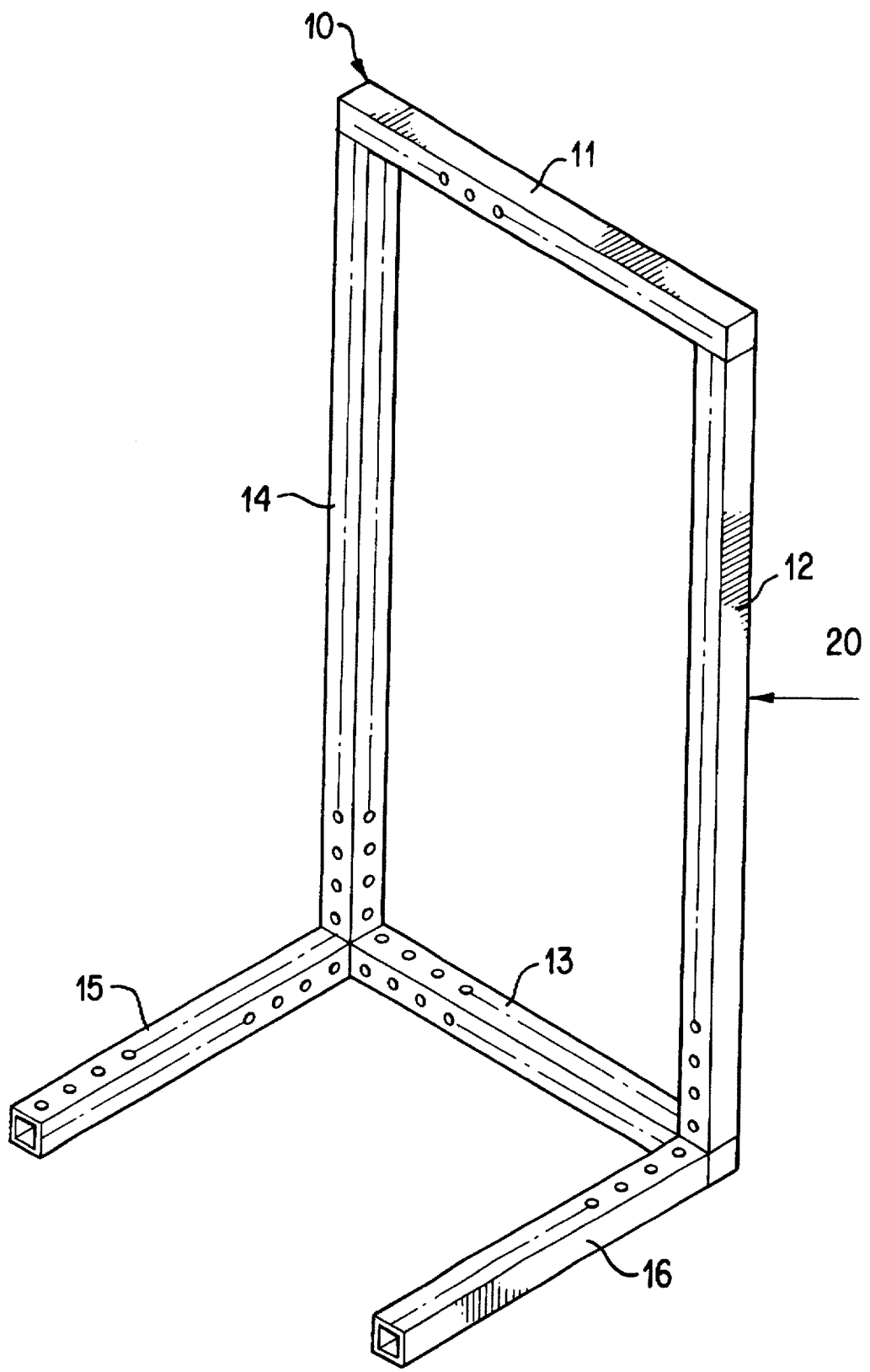
FIG.1 is a perspective front elevation of a partial frame structure comprising a base frame and two frame limbs.

As shown in FIG. 1 a partial frame structure 20 is first erected from the delivered components. This partial frame structure 20 comprises a base frame 10 composing four frame limbs 11, 12, 13 and 14 and two frame limbs 15 and 16 which vertically project from and, are fitted to the bottom corners of, the base frame 10. The base frame 10 may be assembled at the site of use or supplied by the manufacturer in pre-manufactured form. The partial frame structure 20 may be erected as shown in FIG. 1, the base frame 10 preferably facing the rear of the switch cabinet.

Figure 2:
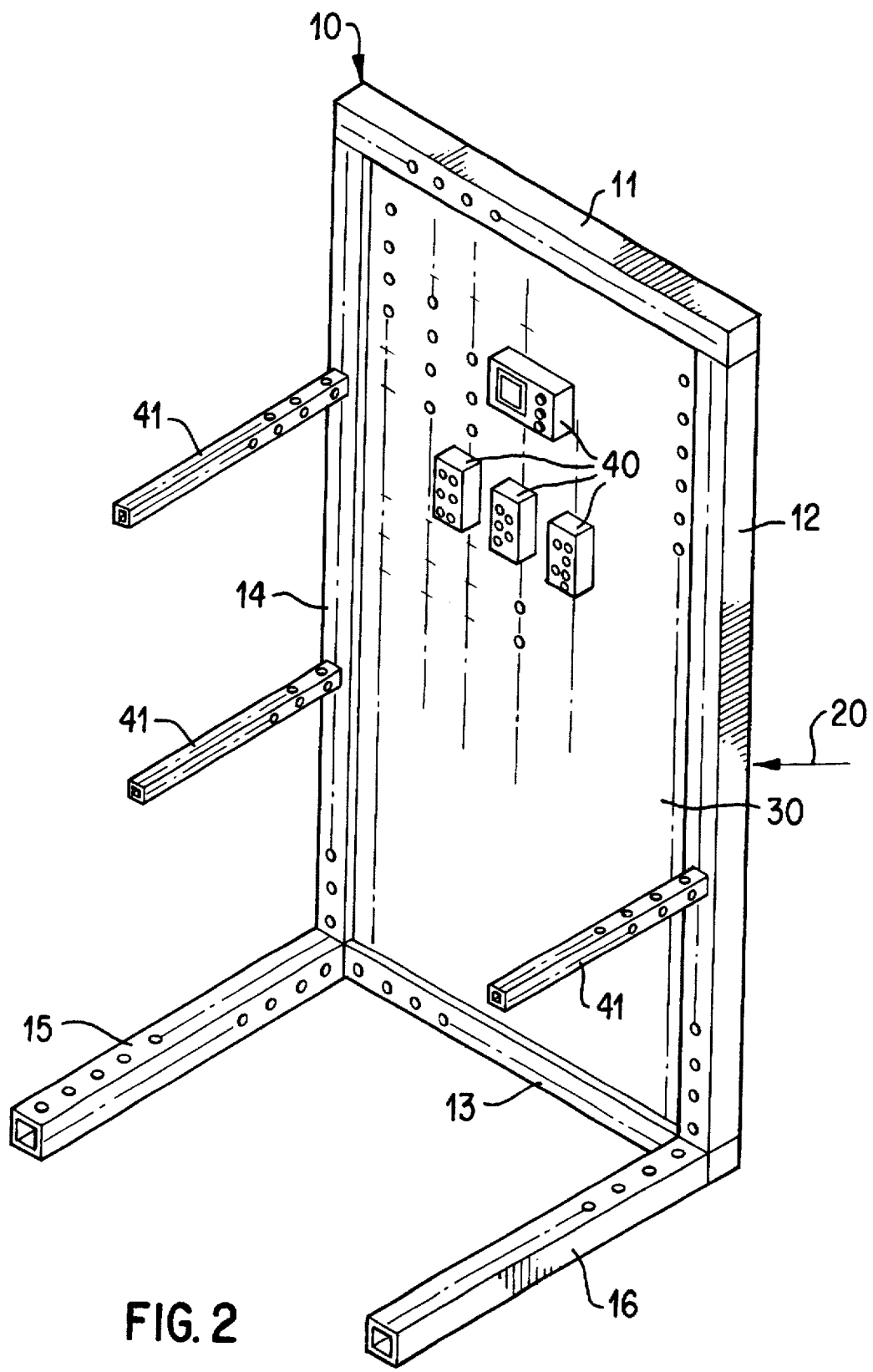
FIG.2 is a perspective front elevation of the partial frame structure including the built in mounting panel and fitted mounting rails.
Figure 3:
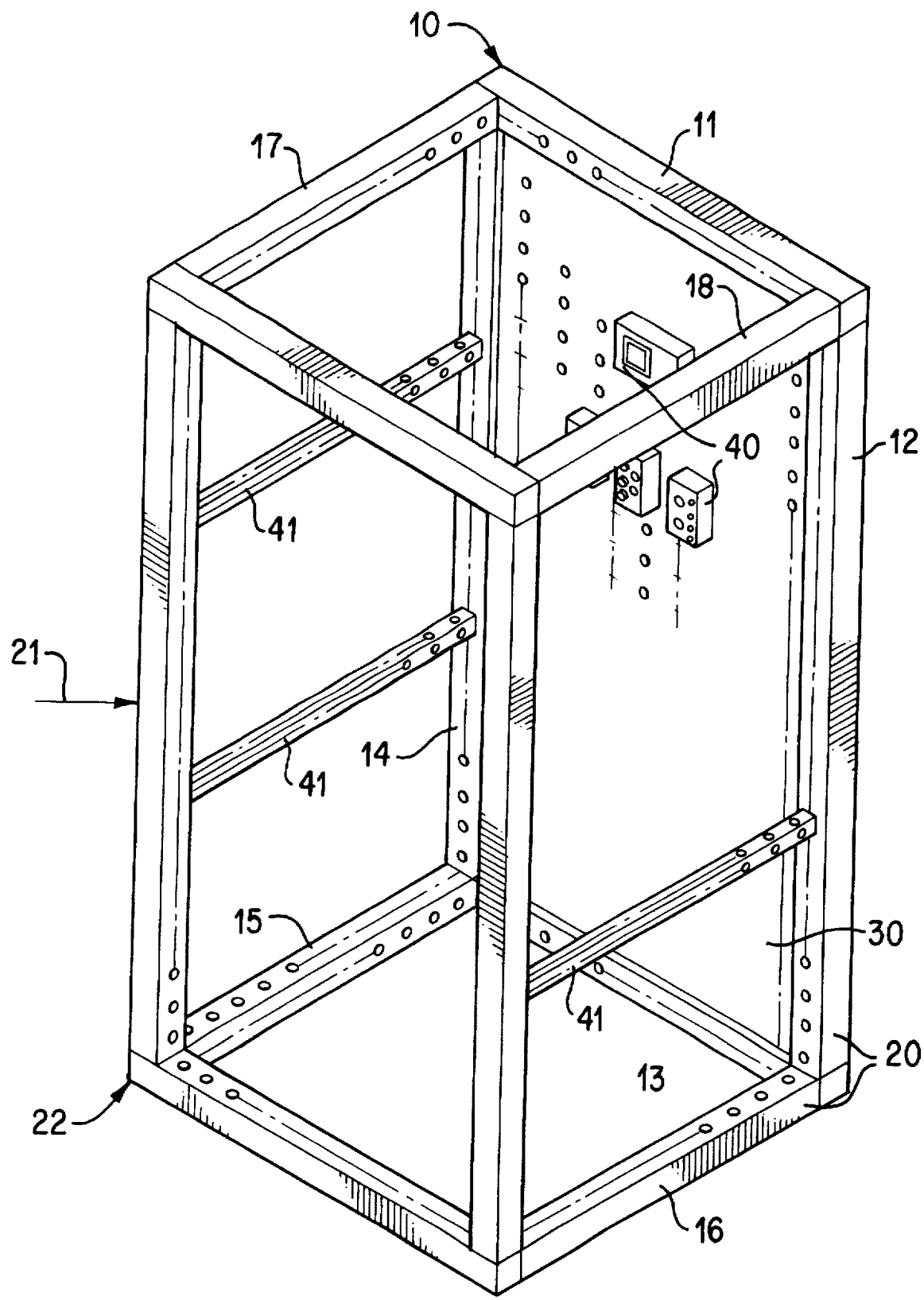
FIG.3 is a perspective front elevation of the completed frame structure including the services.
Figure 4:
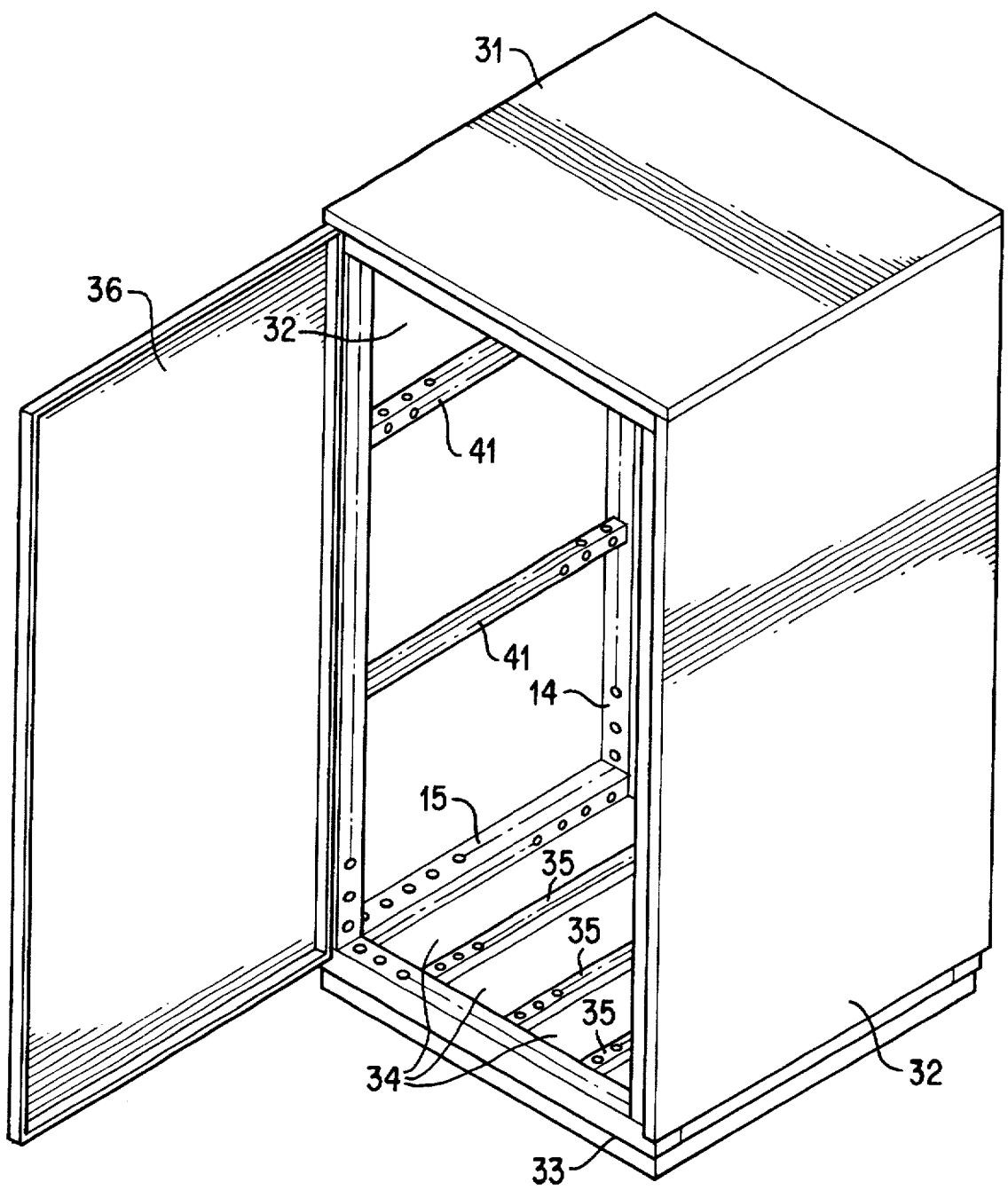
FIG.4 is a perspective front elevation of the completed switch cabinet.

Services may then be installed into the partial frame structure 20 and wired therein without hindrance. As shown in FIG. 2, a wired mounting plate 30, fitted with installation apparatus 40 is inserted into the partial frame structure 20 and connected to the base frame 10. Furthermore, additional mounting rails 41 may be fitted to the base frame 10 and may be designed as guide means for extendible module carriers. The installation of services is left to the user and depends on the user's purpose. The partial frame structure 20 is completed as shown in FIG. 3 after the installation of the services, or in conjunction therewith, to form the frame structure 21. For that purpose, the upper frame limbs 17 and 18 are connected to the base frame 10 and a further frame 22 completes the frame structure 21. The frame 22 is connected to the free ends of the frame limbs 15, 16, 17 and 18 and is connected to the free ends of the mounting rails 41.

Once the frame structure 21 is complete, fitted with all services, and wired, the cabinet door 36 by which the front of the frame structure 21 can be closed is hinged to the frame structure 21. The remaining sides and the top are closed by wall elements 32 and 31. The undersides of the frame structure 21 is fitted to a pedestal 33 and closed by sectional bottom panels 34. Between the sectional bottom panel 34, cable ducts 35 are provided.

The upperside of the frame structure can be fitted with a groove superstructure or the like in which a cooling apparatus can be accommodated or through which cable introduction can take place.

The process according to this invention may also be so modified that a plurality of partial frame structures 20 are fitted together in a row, services 30, 40, 41 are introduced into the partial frame structure 20 and wired up, the partial frame structure 20 being completed to form the frame structures 21, and the frame structures 21 are closed by cabinet doors 36 and wall elements 31, 32 to form a cabinet row.

We claim:

1. A process for erection of a switch cabinet comprising a plurality of frame limbs, at least one cabinet door and a plurality of wall elements, and for installation and wiring of at least one fitting to be accommodated in the switch cabinet, said at least one fitting selected from the group consisting of a mounting plate, mounting rails, module carriers, installation instruments and combinations thereof, the process comprising the steps of:

assembling from four of said frame limbs (11, 12, 13, 14) a basic frame structure (10), fitting at least one additional said frame limb (15, 16) to at least each of the bottom corners of said basic frame structure (10) perpendicular to said basic frame structure (10) so as to form a partial frame structure (20), installing and wiring at least one service device (40) into said partial frame structure (20), completing assembly of a framework (21) of the partial frame structure (20) and attaching at least one cabinet door (36) and the wall elements (31, 32) to the framework (21) having said at least one service device (40) installed therein.

2. A process according to claim 1 further comprising connecting an additional frame (22) to the partial frame structure (20) to form the complete framework (21).

3. A process according to claim 1 further comprising connecting a lower side of the framework (21) to a pedestal (33) and closing off the underside of the framework (21) by at least one sectional bottom panel (34) having at least one cable duct (35).

4. A process according to claim 1 further comprising inserting a mounting panel (30) fitted with said at least one service device (40) into the partial frame structure (20) and connecting said mounting panel (30) to the basic frame structure (10).

5. A process according to claim 1 further comprising connecting a plurality of mounting rails (41) to the partial frame structure (20).

6. A process according to claim 1 further comprising inserting and wiring a plurality of module carriers into the partial frame structure (20).

7. A process according to claim 1, wherein a top of the framework (21) is fitted with a roof superstructure.

8. A process according to claim 1 further comprising lining up a plurality of said partial frame structures (20), inserting and wiring the at least one said service device (40) into each of the partial frame structures (20), completing the partial frame structures(20) to form a plurality of said frameworks (21), and closing off the frameworks (21) by said at least one cabinet door (36) and said wall elements (31, 32) resulting in formation of a cabinet row.

9. A process according to claim 2 further comprising connecting a lower side of the framework (21) to a pedestal (33) and closing off the underside of the framework (21) by at least one sectional bottom panel (34) having at least one cable duct (35).

10. A process according to claim 9 further comprising inserting a mounting panel (30) fitted with said at least one service device (40) into the partial frame structure (20) and connecting said mounting panel (30) to the basic frame structure (10).

11. A process according to claim 10 further comprising connecting a plurality of mounting rails (41) to the partial frame structure (20).

12. A process according to claim 11 further comprising inserting and wiring a plurality of module carriers into the partial frame structure (20).

13. A process according to claim 12, wherein a top of the framework (21) is fitted with a roof superstructure.

14. A process according to claim 13 further comprising lining up a plurality of said partial frame structures (20), inserting and wiring the at least one said service device (40) into each of the partial frame structures (20), completing the partial frame structures (20) to form a plurality of said frameworks (21), and closing off the frameworks (21) by said at least one said cabinet door (36) and said wall elements (31, 32) resulting in formation of a cabinet row.

* * * * *